(12) United States Patent
Bhatti et al.

(10) Patent No.: US 7,204,299 B2
(45) Date of Patent: Apr. 17, 2007

(54) COOLING ASSEMBLY WITH SUCESSIVELY CONTRACTING AND EXPANDING COOLANT FLOW

(75) Inventors: Mohinder Singh Bhatti, Amherst, NY (US); Shrikant Mukund Joshi, Williamsville, NY (US); Ilya Reyzin, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 75 days.

(21) Appl. No.: 10/984,422

(22) Filed: Nov. 9, 2004

(65) Prior Publication Data

US 2006/0096742 A1    May 11, 2006

(51) Int. Cl.
*F28D 15/00* (2006.01)
*H05K 7/20* (2006.01)

(52) U.S. Cl. .............................. 165/104.33; 165/80.4; 361/699

(58) Field of Classification Search ............... 165/80.4, 165/104.21, 104.33, 122, 185, 168, 170; 361/698, 699, 700, 702; 257/714
See application file for complete search history.

(56) References Cited

U.S. PATENT DOCUMENTS

| | | | |
|---|---|---|---|
| 4,341,432 A * | 7/1982 | Cutchaw ..................... 439/485 |
| 4,531,146 A * | 7/1985 | Cutchaw ..................... 257/713 |
| 4,953,634 A | 9/1990 | Nelson ........................ 165/147 |
| 5,028,989 A * | 7/1991 | Naganuma et al. ......... 257/714 |
| 5,239,200 A * | 8/1993 | Messina et al. ............. 257/714 |
| 5,998,863 A | 12/1999 | Kobayashi ................... 257/715 |
| 6,360,814 B1 | 3/2002 | Tanaka ................... 165/104.33 |
| 6,867,973 B2 * | 3/2005 | Chang ......................... 361/699 |
| 6,907,921 B2 * | 6/2005 | Insley et al. ................. 165/170 |
| 2002/0195229 A1* | 12/2002 | Hsieh et al. ................ 165/80.3 |
| 2004/0163798 A1* | 8/2004 | Ghosh et al. ........... 165/104.21 |

FOREIGN PATENT DOCUMENTS

WO    02/092897 A1    11/2002

* cited by examiner

*Primary Examiner*—Tho Duong
(74) *Attorney, Agent, or Firm*—Patrick M. Griffin

(57) ABSTRACT

A fluid heat exchanger assembly having an upper wall and a lower wall extending between the inlet and the outlet for establishing a direction of flow to cool an electronic device. A plurality of projections extend linearly transversely across the direction of flow to define rows of projections with linear cavities between adjacent projections so that fluid flows into and out of the cavities as the fluid flows across the rows of projections for contraction and expansion of the coolant flow to maximize heat transfer. The projections may be rectangular, triangular or convex, as viewed in cross section.

5 Claims, 4 Drawing Sheets

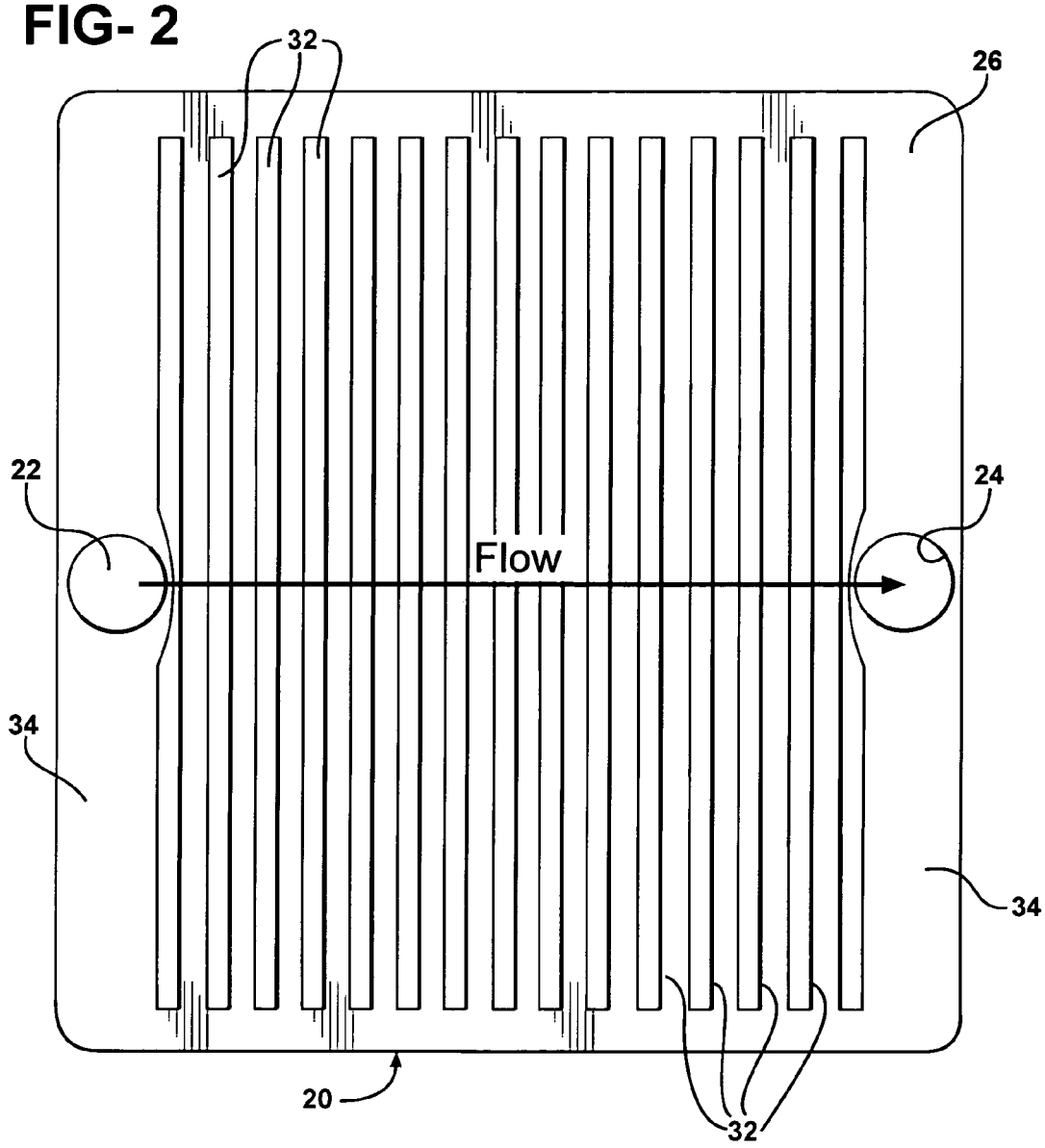

COOLING ASSEMBLY WITH SUCESSIVELY CONTRACTING AND EXPANDING COOLANT FLOW

BACKGROUND OF THE INVENTION

1. Field of the Invention

A fluid heat exchanger assembly for cooling an electronic device.

2. Description of the Prior Art

Research activities have focused on developing assemblies to efficiently dissipate heat from electronic devices that are highly concentrated heat sources, such as microprocessors and computer chips. These electronic devices typically have power densities in the range of about 5 to 35 W/cm$^2$ and relatively small available space for placement of fans, heat exchangers, heat sink assemblies and the like. However, these electronic devices are increasingly being miniaturized and designed to achieve increased computing speeds that generate heat up to 200 W/cm$^2$.

Heat exchangers and heat sink assemblies have been used that apply natural or forced convection cooling methods to cool the electronic devices. These heat exchangers typically use air to directly remove heat from the electronic devices. However, air has a relatively low heat capacity. Such heat sink assemblies are suitable for removing heat from relatively low power heat sources with power density in the range of 5 to 15 W/cm$^2$. The increased computing speeds result in corresponding increases in the power density of the electronic devices in the order of 20 to 35 W/cm$^2$ thus requiring more effective heat sink assemblies.

In response to the increased heat to be dissipated, liquid-cooled units called LCUs employing a cold plate in conjunction with high heat capacity fluids, like water and water-glycol solutions, have been used to remove heat from these types of high power density heat sources. One type of LCU circulates the cooling liquid so that the liquid removes heat from the heat source, like a computer chip, affixed to the cold plate, and is then transferred to a remote location where the heat is easily dissipated into a flowing air stream with the use of a liquid-to-air heat exchanger and an air moving device such as a fan or a blower. These types of LCUs are characterized as indirect cooling units since they remove heat from the heat source indirectly by a secondary working fluid, generally a single-phase liquid, which first removes heat from the heat source and then dissipates it into the air stream flowing through the remotely located liquid-to-air heat exchanger.

As computing speeds continue to increase even more dramatically, the corresponding power densities of the devices rise up to 200 W/cm$^2$. The constraints of the miniaturization coupled with high heat flux generated by such devices call for extremely efficient, compact, and reliable thermosiphon cooling units called TCUs. A typical TCU absorbs heat generated by the electronic device by vaporizing the captive working fluid on a boiler plate of the unit. The boiling of the working fluid constitutes a phase change from liquid-to-vapor state and as such the working fluid of the TCU is considered to be a two-phase fluid. The vapor generated during boiling of the working fluid is then transferred to an air-cooled condenser, in close proximity to the boiler plate, where it is liquefied by the process of film condensation over the condensing surface of the TCU. The heat is rejected into an air stream flowing over a finned external surface of the condenser. The condensed liquid is returned back to the boiler plate by gravity to continue the boiling-condensing cycle. These TCUs require boiling and condensing processes to occur in close proximity to each other thereby imposing conflicting thermal conditions in a relatively small volume. This poses significant challenges to the process of optimizing the TCU performance.

Illustrative examples of the prior art are shown in U.S. Pat. Nos. 6,360,814; 5,998,863; 5,239,200 and 4,953,634. The '814 patent discloses a TCU having a boiler plate with rectangular shaped fins. The rectangular shaped fins dissipate heat from the electronic device. The '863 patent discloses another TCU having a boiler plate with fins for dissipating heat. The fins are transverse to the cooling fluid flow and therefore restrict the flow of the cooling fluid and divide the chamber into discrete compartments. Such a design reduces the amount of heat that the TCU is capable of dissipating. In the '200 patent, all of the flow of coolant is tortuous and in the '634 patent, the cross sectional area of the flow path is decreased and the fins are parallel to the flow path. Another TCU is disclosed in WO 02/092897 having a boiler plate with various shaped fins. The known heat exchangers or heat sinks have upper and lower walls extending between an inlet and an outlet for establishing a direction of flow from the inlet to the outlet. The heat sinks often include projections from the walls to enhance heat transfer. However, the flow is normally parallel to the projections and straight whereby the contact between the flow and the projections is determined by the rate of flow. In order to increase the dwell time for the fluid to be in contact with the projections to increase the heat transfer rate, a zigzag flow path has been utilized as in the '200 patent.

SUMMARY OF THE INVENTION AND ADVANTAGES

In accordance with the subject invention the direction of coolant flow is transverse or across a plurality of projections. The projections extend from one of the walls of a housing to distal extremities with the distal extremities extending linearly transversely across the direction of flow. The projections are spaced from the other wall and from one another to define linear cavities between adjacent projections so that fluid flows into and out of the cavities as the fluid flows across the projections.

Accordingly, as the fluid flows into and out of the cavities as the fluid flows across the projections, the fluid enters and leaves the cavities and experiences expansion and contraction. The fluid flow is constantly and successively expanding and contracting to create turbulence to augment heat transfer. The fluid dwells in the cavities to enhance or increase the heat transfer rate.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 2 is plan view of a heat exchanger assembly of the subject invention;

FIG. 3 is an illustration of a cross sectional view of a first embodiment of an assembly as shown in FIG. 2;

DETAILED DESCRIPTION OF THE PREFERRED EMBODIMENT

Figure 1:
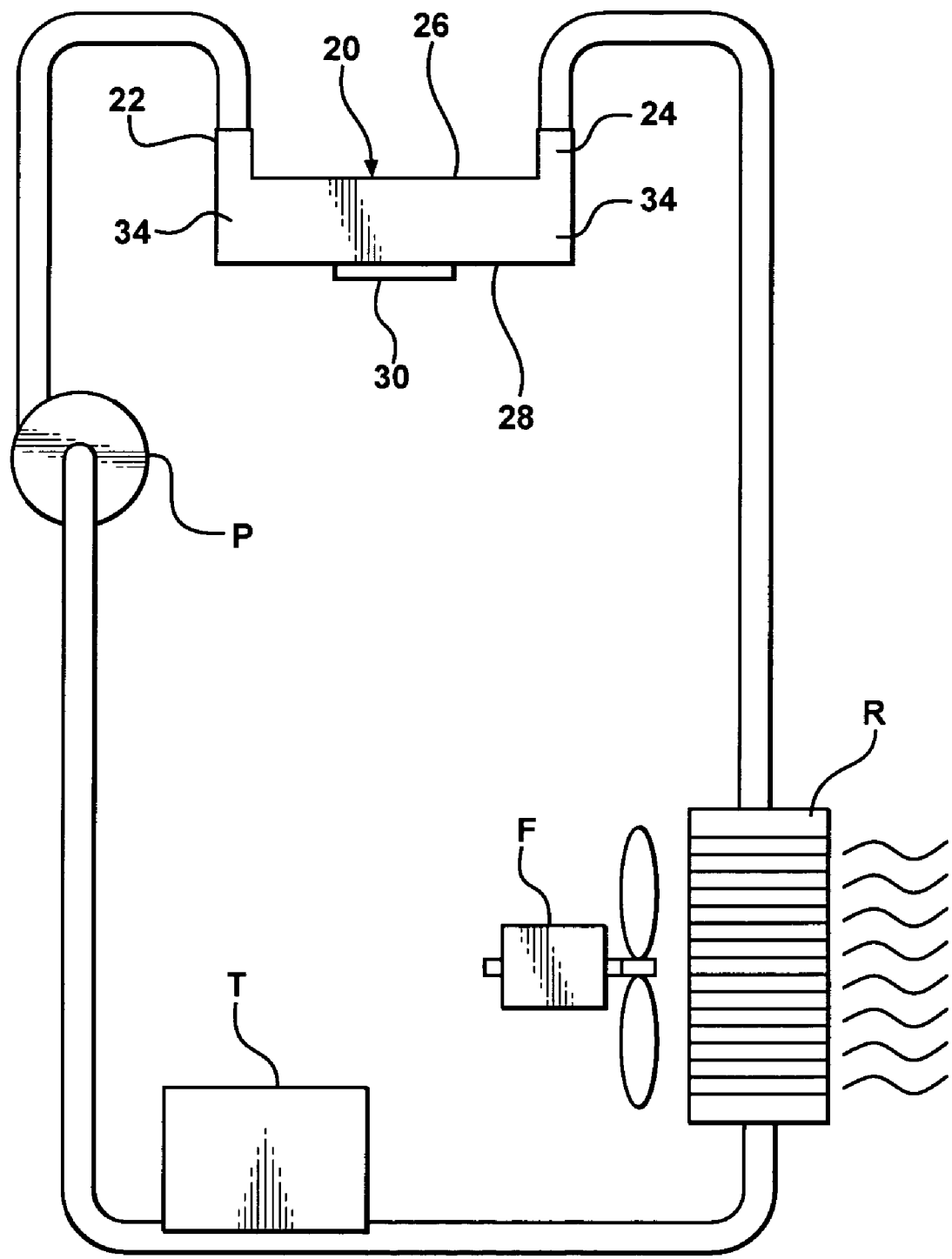
FIG. 1 is a schematic view of a LCU with a cold plate incorporating the heat dissipation element of the subject invention aligned parallel to the working fluid flow.
Figure 4:
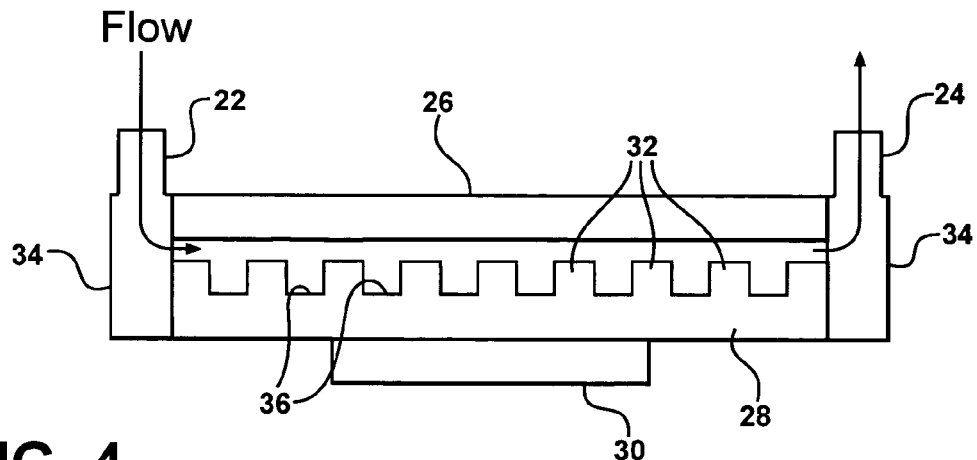
FIG. 4 is an illustration of a cross sectional view of a second embodiment of an assembly as shown in FIG. 2.

A fluid heat exchanger assembly is shown in FIG. 2. The assembly comprises a housing 20 having an inlet 22 and an outlet 24 and an upper wall 26 and a lower wall 28 extending between the inlet 22 and the outlet 24 for establishing a direction of flow (indicated by the arrow) from the inlet 22 to the outlet 24. The assembly is used to cool an electronic device 30.

A plurality of projections 32 extend from one of the walls to distal extremities and the distal extremities extend linearly transversely across the direction of flow between the header tanks 34 at the inlet 22 and outlet 24 of the housing 20 to define rows of projections 32. The inlet 22 feeds cooling fluid into the header tank 34 at the inlet 22 of the housing 20 and the outlet 24 conveys the coolant away from the header tank 34 at the outlet 24 of the housing 20.

The distal extremities of projections 32 are spaced from one another to define linear cavities 36 between adjacent projections 32 so that fluid flows into and out of the cavities 36 as the fluid flows across the rows of projections 32. The distal extremities of projections 32 are also spaced from the other wall to define a flow space extending straight over the projections 32 and along the direction of flow.

The operation of the heat exchanger housing 20 is incorporated into a liquid cooling system as illustrated in FIG. 1. The electronic device 30 generates an amount of heat to be dissipated and the heat is transferred from the electronic device 30 to the bottom of the heat exchanger housing 20. The heat is then conducted from the bottom to the projections 32 or fins and thence to the cooling fluid. A working fluid mover, such as a pump P, moves a fluid, usually a liquid, through a working fluid storage tank T, that stores excess working fluid. The pump P moves the cooling fluid through a heat extractor or radiator assembly to dissipate heat from the cooling fluid, the heat extractor or radiator assembly including a fan F and radiator R. The radiator R can be of the well known type including tubes with cooling fins between the tubes to exchange heat between the cooling fluid passing through the tubes and air forced through the fins by the fan F.

Figure 7:
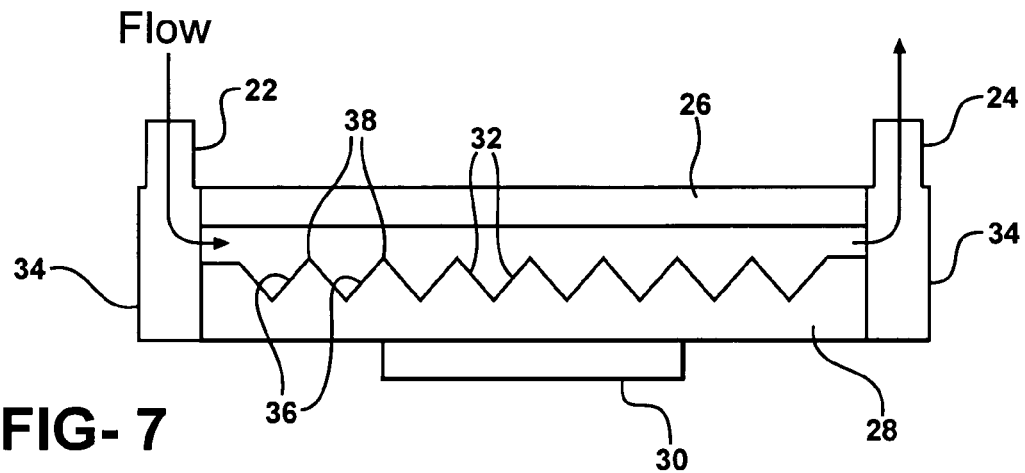
FIG. 7 is an illustration of a cross sectional view of a fifth embodiment of an assembly as shown in FIG. 2.
Figure 8:
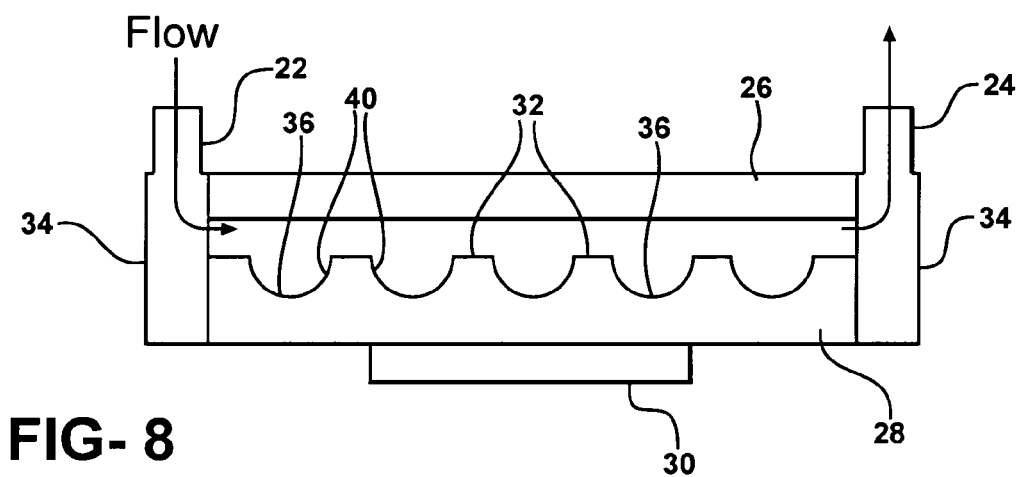
FIG. 8 is an illustration of a cross sectional view of a sixth embodiment of an assembly as shown in FIG. 2.
Figure 9:
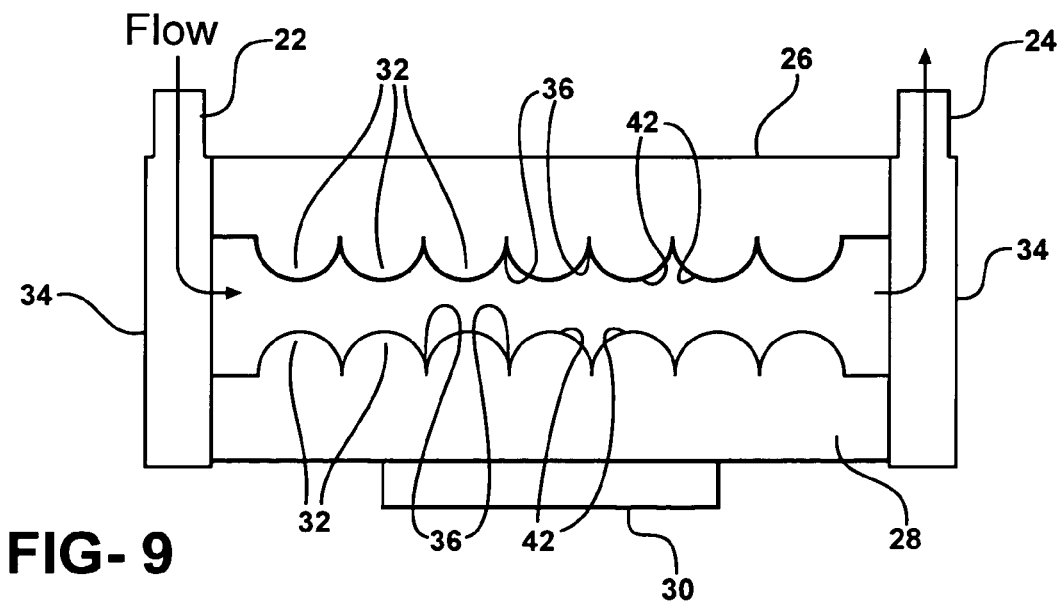
FIG. 9 is an illustration of a cross sectional view of a seventh embodiment of an assembly as shown in FIG. 2.

The projections 32 may have any number of cross sectional shapes over which the fluid flows into an out of the cavities 36 between the projections 32. As illustrated in FIGS. 3–9, each projection 32 presents at least one corner extending therealong. More specifically, each of the projections 32 in FIGS. 3–6 and 8 is three sided as viewed in cross section to present two corners defining a rectangular shaped projection 32. In the embodiment of FIG. 7, each of the projections 32 is two sided as viewed in cross section to present one corner defining an apex 38 of a triangular shaped projection 32. In the embodiment of FIG. 8, each of the cavities 36 is concave 40 and the cavities 36 are spaced to present square or rectangular projections 32. In the embodiment of FIG. 9, each of the projections 32 is convex 42 as viewed in cross section to present a curve shaped projection 32.

In the embodiments of FIGS. 3 and 9, the projections 32 extend from both of the walls 26, 28 to define the flow space between the opposed distal extremities and extending straight over the projections 32 and along the direction of flow. The projections 32 extending from the opposing walls 26, 28 in FIGS. 3 and 9 are mirror images of one another so that the cavities 36 along opposite walls 26, 28 are opposite one another, i.e., face one another.

The projections 32 may extend from both walls 26, 28, as shown in FIGS. 3 and 9, or only from one of the walls 26, 28, as shown in FIGS. 4–8.

Figure 5:
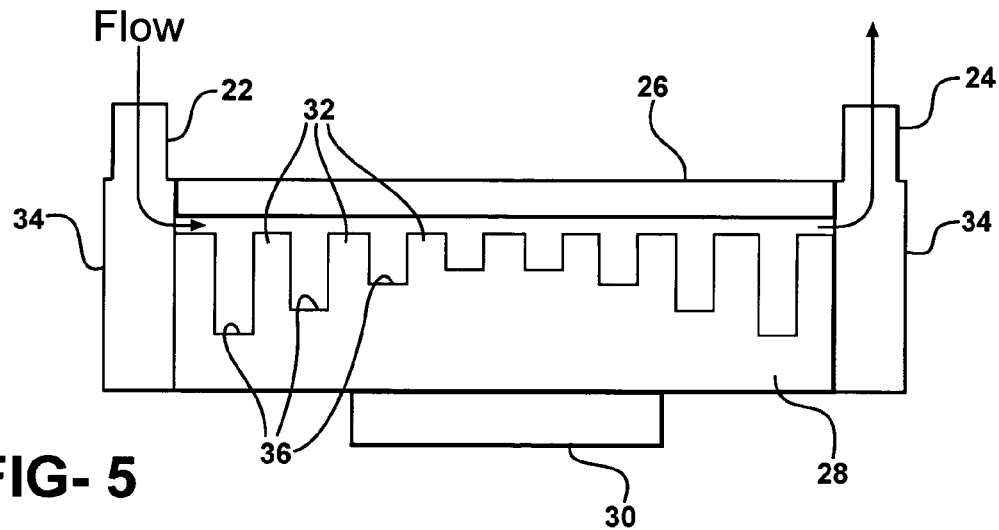
FIG. 5 is an illustration of a cross sectional view of a third embodiment of an assembly as shown in FIG. 2.
Figure 6:
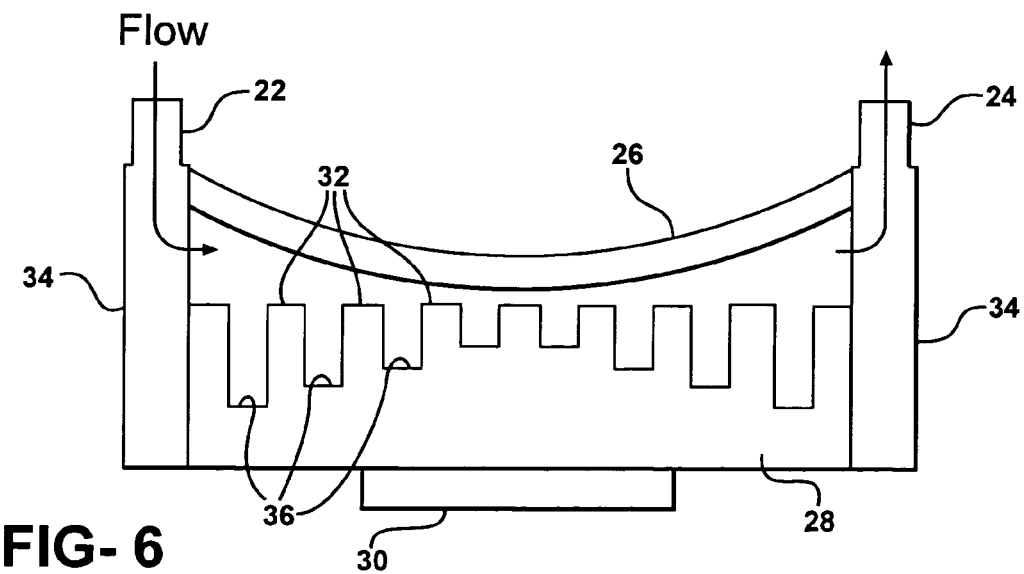
FIG. 6 is an illustration of a cross sectional view of a fourth embodiment of an assembly as shown in FIG. 2.

In all of the embodiments except those of FIGS. 5 and 6, the upper wall 26 is parallel to the opposing lower wall 28, whereas at least one of the walls is curved in the direction of flow in the embodiments of flow in the embodiments of FIGS. 5 and 6. In the embodiment of FIGS. 5 and 6, the lower wall 28 from which the projections 32 extend is the curved wall to define projections 32 of varying extension in the direction of flow. More specifically, the cavities 36 in the embodiment of FIGS. 5 and 6 are square or parallel to one another but are disposed on a curve from center to center so that the curved lower wall 28 presents a mound as viewed in cross section in the direction of flow to define projections 32 of greater extension adjacent the inlet 22 and outlet 24 than midway there between. In addition, the opposite or upper wall 26 in the embodiment of FIG. 6 is also curved so that the opposing walls are curved.

The cavities 36 may be formed by brazing two identical extruded of stamped plates presenting the walls 26, 28 with the fins or projections 32 presenting a gap or space for straight flow for a portion of the fluid flow while the remainder flows into and out of the cavities 36. As alluded to above, the plates or and projections 32 may be formed with the cavities 36 having a constant or varying depths, i.e., the projections 32 have constant or varying heights for the wall 26, 28 from which they extend.

Obviously, many modifications and variations of the present invention are possible in light of the above teachings. The invention may be practiced otherwise than as specifically described within the scope of the appended claims.

What is claimed is:

1. A fluid heat exchanger assembly for cooling an electronic device with a cooling fluid supplied from a heat extractor (R, F) and comprising;

a housing having an inlet and an outlet and upper and lower walls extending between said inlet and said outlet for establishing a direction of flow from said inlet to said outlet, a plurality of projections extending from one of said walls to distal extremities and said distal extremities extending linearly transversely across said direction of flow and spaced from the other wall and from one another to define linear cavities between adjacent projections so that fluid flows into and out of said cavities as the fluid flows across said projections, and one of said walls being curved about an axis perpendicular to said direction of flow with said cavities being disposed on a curve from cavity to cavity between said inlet and said outlet so that the lower curved wall presents a mound.

2. An assembly as set forth in claim 1 wherein said projections extend from only one of said walls.

3. An assembly as set forth in claim 1 wherein each of said projections presents at least one corner extending there along.

4. An assembly as set forth in claim 3 wherein each of said projections is three sided as viewed in cross section to present two corners defining a rectangular shaped projection.

5. A fluid heat exchanger assembly for cooling an electronic device with a cooling fluid supplied from a heat extractor (R, F) and comprising;
   a housing having an inlet and an outlet and upper and lower walls extending between said inlet and said outlet for establishing a direction of flow from said inlet to said outlet,
   a plurality of projections extending from one of said walls to distal extremities and said distal extremities extending linearly transversely across said direction of flow and spaced from the other wall and from one another to define linear cavities between adjacent projections so that fluid flows into and out of said cavities as the fluid flows across said projections, and
   one of said walls being curved about an axis perpendicular to said direction of flow to present a mound as viewed in cross section to define projections of greater extension adjacent said inlet and outlet than midway therebetween.

* * * * *